US012402350B2

(12) United States Patent
Tsai et al.

(10) Patent No.: US 12,402,350 B2
(45) Date of Patent: Aug. 26, 2025

(54) PASSIVATION STRUCTURE FOR A THIN FILM TRANSISTOR

(71) Applicant: Taiwan Semiconductor Manufacturing Company, Ltd., Hsinchu (TW)

(72) Inventors: Wu-Wei Tsai, Taoyuan (TW); Hai-Ching Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 861 days.

(21) Appl. No.: 17/412,359

(22) Filed: Aug. 26, 2021

(65) Prior Publication Data

US 2023/0062886 A1    Mar. 2, 2023

(51) Int. Cl.
*H10D 30/67*    (2025.01)
*H10D 30/01*    (2025.01)

(52) U.S. Cl.
CPC ....... *H10D 30/6713* (2025.01); *H10D 30/031* (2025.01)

(58) Field of Classification Search
CPC .................. H01L 29/78618; H01L 29/66742
See application file for complete search history.

(56) References Cited

U.S. PATENT DOCUMENTS

| | | | |
|---|---|---|---|
| 10,186,568 B2 * | 1/2019 | Kim | H10K 59/123 |
| 2011/0070691 A1 * | 3/2011 | Ye | H01L 29/7869 |
| | | | 257/E21.411 |
| 2015/0053970 A1 * | 2/2015 | Lee | H10D 30/6757 |
| | | | 257/43 |
| 2019/0252478 A1 * | 8/2019 | Son | H01L 27/124 |
| 2021/0020872 A1 * | 1/2021 | Park | H10D 30/6755 |

OTHER PUBLICATIONS

Anstrom Engineering. "Thin Film Transistors." The date of publication is unknown. Retrieved online on Oct. 20, 2020 from https://angstromengineering.com/.
Yasaka, Miho. "X-Ray Thin-Film Measurement Techniques." The Rigaku Journal, 26(2), published in 2010.
Singer, Pete. "Scaling the BEOL: A Toolbox Filled With New Processes, Boosters and Conductors." Semiconductor Digest, published on Feb. 8, 2020.
Wikipedia.org "Thin-Film Transistor." Published on Feb. 8, 2020.
Wikipedia.org "Transparent Conducting Film." Published on Jun. 17, 2020.

* cited by examiner

*Primary Examiner* — Zandra V Smith
*Assistant Examiner* — Andre C Stevenson
(74) *Attorney, Agent, or Firm* — Eschweiler & Potashnik, LLC

(57) ABSTRACT

In some embodiments, the present disclosure relates to a device that includes an active layer, a gate electrode, a passivation structure, a source contact, and a drain contact arranged over a substrate. The gate electrode is arranged over the substrate and is spaced apart from the active layer by a gate dielectric layer. The passivation structure is arranged over the active layer. The source contact extends through the passivation structure and contacts the active layer. The drain contact extends through the passivation structure and contacts the active layer. The passivation structure is hydrophobic.

20 Claims, 15 Drawing Sheets

1600A

1600B

PASSIVATION STRUCTURE FOR A THIN FILM TRANSISTOR

BACKGROUND

As technology advances at a rapid pace, engineers work to make devices smaller, yet more complex to improve and develop electronic devices that are more efficient, more reliable, and have more capabilities. One way to achieve these goals is by improving the design of transistors, as electronic devices comprise a plethora of transistors that together, carry out the function of the device. Overall electronic device performance may benefit from transistors that, for example, are smaller, consume less power, and have faster switching speeds.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
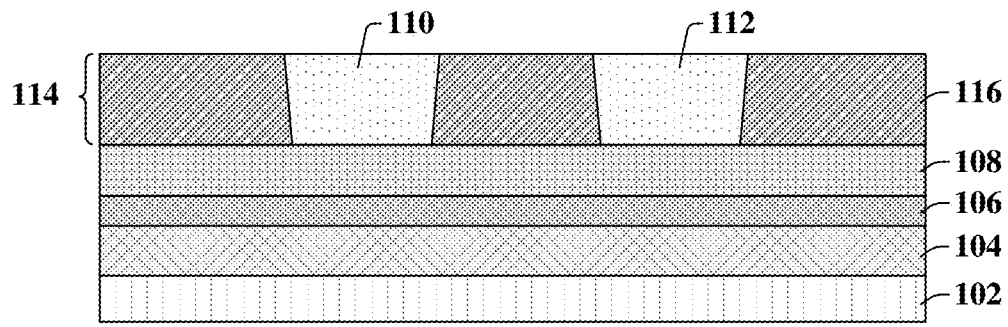
FIG. 1A illustrates a cross-sectional view of some embodiments of a bottom-gate thin film transistor comprising a passivation structure arranged over an active layer and comprising silicon carbide.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a transistor, for example, thin film transistor (TFT) comprises an active layer arranged over a substrate. The active layer may be turned "ON" such that mobile charge carriers flow through the active layer when signals (e.g., voltage, current) are applied to source, drain, and gate contacts of the TFT. The substrate of a TFT is often not a conductive material, but instead is a supportive substrate for the active layer of the TFT. For example, in some instances, the substrate is a transparent material such as glass because TFTs may be used in optical applications such as for liquid-crystal displays. The active layer is thinner than a typical semiconductor substrate used in other transistors, such as planar metal oxide semiconductors field effect transistors (MOSFET). In some instances, the active layer comprises a semiconductor material that is transparent such as, for example, indium gallium zinc oxide (IGZO), amorphous silicon, or some other suitable material.

In some embodiments of a top-gate TFT, the gate electrode is arranged over the active layer and directly between a source contact and a drain contact. The gate electrode, the source contact, and the drain contact may be spaced apart from one another by a passivation layer. In some embodiments of a bottom-gate TFT, the gate electrode is arranged below the active layer and the source contact and the drain contact are arranged over the active layer. The source contact and the drain contact are spaced apart from one another by a passivation structure. The passivation structure of a TFT covers the active layer and comprises a material used to mitigate or prevent water and oxygen from the environment from diffusing into the active layer and degrading the TFT. However, oftentimes, the passivation structure comprises silicon dioxide which requires a low processing temperature (e.g., less than 300 degrees Celsius) to prevent damage to the silicon dioxide. Thus, if the passivation structure becomes damaged when exposed to high temperatures (e.g., greater than 300 degrees Celsius) during processing, the passivation layer may fail in effectively protecting the active layer, thereby reducing the TFT reliability. Further, silicon dioxide may be hydrophilic and have a low film density which would allow moisture to enter the passivation structure and diffuse into the active layer.

Various embodiments of the present disclosure relate to forming a top-gate or a bottom-gate TFT with a passivation structure arranged over the active layer that has one or more layers comprising materials that are more reliable in mitigating the diffusion of water and oxygen into the active layer than silicon dioxide. In some embodiments, at least an upper portion of the passivation structure comprises oxygen-doped silicon carbide (ODC), nitrogen-doped silicon carbide (NDC), or a mixture thereof. In such embodiments, ODC and NDC are more effective in preventing moisture (e.g., water) and oxygen from the environment from diffusing into the active layer than silicon dioxide because ODC and NDC are hydrophobic and have a higher film density than silicon dioxide. Further, ODC and NDC are commonly used in back-end-of-line metal processing, and thus, incorporating ODC and NDC into the passivation structure of the TFT may be easier because equipment and precursors used for ODC and NDC processing is already available. By incorporating ODC and/or NDC materials into the passivation structure of a TFT, damage to the TFT from the environment is mitigated thereby increasing the longevity and reliability of the TFT.

FIG. 1A illustrates a cross-sectional view 100A of some embodiments of an integrated chip comprising a bottom-gate thin film transistor (TFT).

The bottom-gate TFT of FIG. 1A includes a gate electrode 104 arranged over a substrate 102. Further, in some embodiments, the gate electrode 104 is arranged below an active layer 108. In some embodiments, the gate electrode 104 is spaced apart from the active layer 108 by a gate dielectric layer 106. Because the gate electrode 104 is arranged between the active layer 108 and the substrate 102, the TFT of FIG. 1A is called a "bottom-gate" TFT. In some embodiments, the substrate 102 is a supportive, non-semiconducting substrate. For example, in some embodiments, the substrate 102 comprises a glass, or some other rigid, supportive material.

In some embodiments, the active layer 108 comprises a semiconductor material. In some embodiments, the substrate 102 and the active layer 108 comprise transparent materials because the bottom-gate TFT may be used in some optical applications. Examples of transparent materials for the active layer 108 include indium gallium zinc oxide, indium tin oxide, indium gallium oxide, indium zinc oxide, indium gallium zinc tin oxide, indium oxide, or some other suitable material. Further, examples of transparent materials for the gate dielectric layer 106 include hafnium oxide, zirconium oxide, aluminum oxide, lanthanum oxide, silicon dioxide, silicon nitride, a combination thereof, or some other suitable dielectric material. Examples of transparent materials for the gate electrode 104 include indium tin oxide, doped zinc oxide, or some other suitable transparent, conductive material. It will be appreciated that in some other embodiments, the bottom-gate TFT is not used in optical applications and thus, does not comprise as many transparent materials.

In some embodiments, a passivation structure 114 is arranged over the active layer 108, and a source contact 110 and a drain contact 112 extend through the passivation structure 114 to contact the active layer 108. Thus, in some embodiments, the bottom-gate TFT is turned "ON" when signals (e.g., voltage, current) are applied to the gate electrode 104, the source contact 110, and the drain contact 112 that exceed a threshold voltage of the bottom-gate TFT such that mobile charge carriers (e.g., holes or electrons) flow through the active layer 108. In some embodiments, the passivation structure 114 protects the active layer 108 from damage from the environment. For example, the passivation structure 114 mitigates moisture (e.g., water) and oxygen from the surrounding environment of the bottom-gate TFT from diffusing into the active layer 108 which may damage the active layer 108 and thus, reduce the reliability and/or longevity of the bottom-gate TFT.

In some embodiments, an effective material for the passivation structure 114 has a high film density and is hydrophobic to prevent moisture from entering into the passivation structure 114 and into the active layer 108. Further, the passivation structure 114 comprises an insulator and/or dielectric material to electrically isolate the source contact 110 from the drain contact 112. In some embodiments, the passivation structure 114 has a higher film density than that of silicon dioxide, for example. In some embodiments, the film density of the passivation structure 114 is measured using X-ray reflective (XRR) measurements. An XRR measurement measures a relationship between properties of incident X-rays and reflected X-rays to determine the film density.

In some embodiments, the passivation structure 114 comprises, for example, oxygen-doped silicon carbide, nitrogen-doped silicon carbide, a mixture thereof, or some other suitable material that has a high film density, is hydrophobic, and is electrically insulating. Further, in some embodiments, the passivation structure 114 comprises a material that can maintain these aforementioned properties when exposed to high temperatures (e.g., greater than 250 degrees Celsius) during processing. In some embodiments, the passivation structure 114 has a thickness in a range of between, for example, approximately 5 nanometers and approximately 1000 nanometers. In some embodiments, the passivation structure 114 comprises a first passivation layer 116 that continuously extends in the vertical direction from the active layer 108 to a top of the source and drain contacts 110, 112. Thus, the passivation structure 114 comprises one or more materials that mitigate moisture (e.g., water), oxygen, and/or other vapors/gases in the environment from reaching the active layer 108 to increase the reliability of the bottom-gate TFT.

Figure 1B:
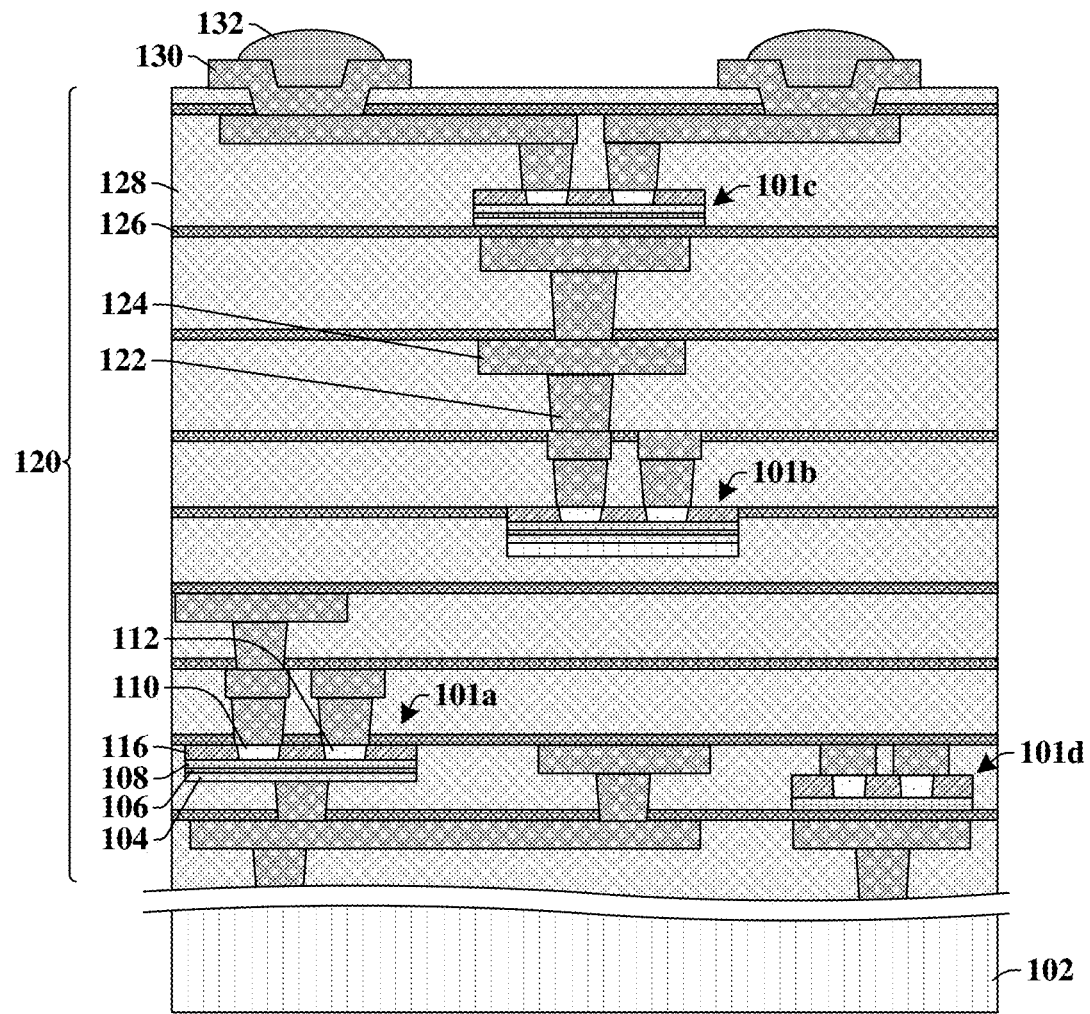
FIG. 1B illustrates a cross-sectional view of some embodiments of the bottom-gate thin film transistor of FIG. 1A in a back-end-of-line interconnect structure.

FIG. 1B illustrates a cross-sectional view 100B of some embodiments of a back-end-of-line (BEOL) interconnect structure comprising the bottom-gate TFT of FIG. 1A.

In some embodiments, a first bottom-gate TFT 101a may be arranged within a back-end-of-line (BEOL) interconnect structure 120 over the substrate 102. Thus, in some embodiments, the gate electrode 104 may not be arranged directly on the substrate 102. In some embodiments, the back-end-of-line (BEOL) interconnect structure 120 may comprise, for example, interconnect vias 122 and interconnect wires 124 embedded within interconnect dielectric layers 128 and etch stop layers 126. In some embodiments, the BEOL interconnect structure 120 further comprises a bond pad 130 arranged over a topmost interconnect wire 124 or interconnect via 122 and comprises a solder bump 132 arranged over the bond pad 130.

In some embodiments, the interconnect vias 122, the interconnect wires 124, the bond pads 130, and the solder bumps 132 comprise conductive materials such as, for example, copper, aluminum, tungsten, tantalum, titanium, tantalum nitride, titanium nitride, or the like. In some embodiments, the interconnect dielectric layers 128 and the etch stop layers 128 may comprise a dielectric material, such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

In some embodiments, the first bottom-gate TFT 101a may be arranged within a lower portion of the BEOL interconnect structure 120, and interconnect vias 122 may be electrically coupled to the source contact 110, the drain contact 112, and the gate electrode 104 of the first bottom-gate TFT 101a. In some embodiments, a second bottom-gate TFT 101b may be arranged in a middle portion of the BEOL interconnect structure 120. Further, in some embodiments, the second bottom-gate TFT 101b may have a gate electrode 104 arranged directly over a substrate 102 of the second bottom-gate TFT 101b or some other supportive structure. In some embodiments, a third bottom-gate TFT 101c may be arranged within an upper portion of the BEOL interconnect structure 120. In some embodiments, the gate electrode 104 may be arranged on the etch stop layer 126, and the gate electrode 104 may be coupled to the interconnect wire 124 below the etch stop layer 126. In some other embodiments, the gate electrode 104 may be arranged directly on the interconnect wire 124. In some such embodiments, the source contact 110 and the drain contact 112 of the third bottom-gate TFT 101c are coupled to the solder bumps 132 through the bond pads 130, interconnect wires 124, and interconnect vias 122.

In some embodiments, a fourth bottom-gate TFT 101d may comprise the active layer 108, the first passivation layer 116, the source contact 110, and the drain contact 112. In some such embodiments, the interconnect wire 124 may serve as the gate electrode of the fourth bottom-gate TFT 101d, and the etch stop layer 126 may serve as the gate dielectric layer of the fourth bottom-gate TFT 101d.

Thus, the cross-sectional view 100B of FIG. 1B illustrates various areas that a bottom-gate TFT may be arranged in a BEOL interconnect structure 120. In some embodiments, high temperatures are used during the formation of the BEOL interconnect structure 120. Thus, because of the bottom-gate TFTs (e.g., 101a-d) comprise a passivation structure (114 of FIG. 1A) that comprise a material that can maintain its properties when exposed to high temperatures (e.g., greater than 250 degrees Celsius), the bottom-gate TFTs (e.g., 101a-d) may be integrated into the BEOL interconnect structure 120 without suffering damage. Further, because of the small size of the bottom-gate TFTs (e.g., 101a-d), the bottom-gate TFTs (e.g., 101a-d) may be integrated in the BEOL interconnect structure 120 without increasing the height of the BEOL interconnect structure 120.

Figure 2:
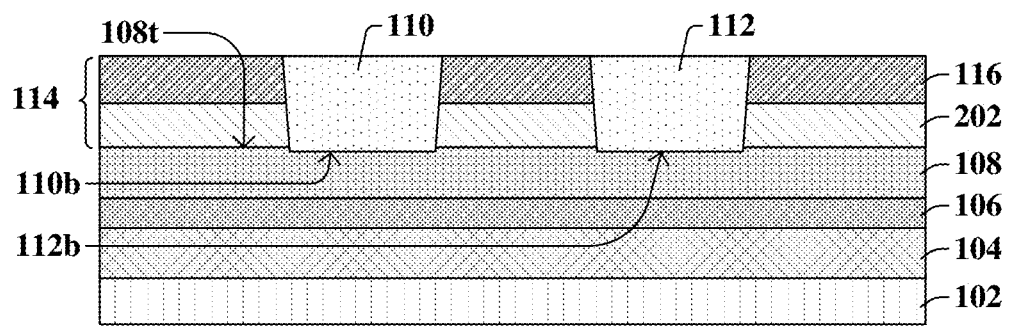
FIG. 2 illustrates a cross-sectional view of some other embodiments of a bottom-gate thin film transistor comprising a passivation structure arranged over an active layer, comprising two layers, and comprising silicon carbide.

FIG. 2 illustrates a cross-sectional view 200 of some other embodiments of a bottom-gate TFT, wherein the passivation structure comprises more than one layer.

In some other embodiments, the passivation structure 114 comprises a second passivation layer 202 arranged between the first passivation layer 116 and the active layer 108. In some such embodiments, the first and second passivation layers 116, 202 laterally surround the source contact 110 and the drain contact 112. In some embodiments, at least the first passivation layer 116, which is an upper portion of the passivation structure 114, comprises a material that has a high film density, is hydrophobic, and is electrically insulating, such as, for example, oxygen-doped silicon carbide, nitrogen-doped silicon carbide, or the like. In some embodiments, the second passivation layer 202 may also comprise a material that has a high film density, is hydrophobic, and is electrically insulating, such as oxygen-doped silicon carbide, nitrogen-doped silicon carbide, or the like.

In other embodiments, the second passivation layer 202 may comprise a material that has a lower film density and/or is less hydrophobic than the first passivation layer 116. For example, in such other embodiments, the second passivation layer 202 may comprise, for example, silicon dioxide, silicon nitride, aluminum oxide, hafnium oxide, hafnium zirconium oxide, or the like. Thus, in some embodiments, the first passivation layer 116 may comprise oxygen-doped silicon carbide and/or nitrogen-doped silicon carbide to mitigate moisture (e.g., water) and oxygen from diffusing into the second passivation layer 202 and into the active layer 108 to increase the reliability of the bottom-gate TFT.

Further, in some embodiments, the source contact 110 may have a bottom surface 110b that is arranged below a topmost surface 108t of the active layer 108. Similarly, in some embodiments, the drain contact 112 may have a bottom surface 112b that is arranged below the topmost surface 108t of the active layer 108. In some such embodiments, the source and drain contacts 110, 112 are formed by first forming openings in the first and second passivation layers 116, 202. During the formation of the openings, portions of the active layer 108 may be removed due to, for example, over etching, in some embodiments, Thus, in some such embodiments, the source and drain contacts 110, 122, which are formed within the openings, have bottommost surfaces, 110b, 112b, respectively, that are arranged below the topmost surface 108t of the active layer 108. In some other embodiments, the active layer 108 is substantially resistant to removal by the removal process used to form the openings, and thus, the bottommost surface 110b of the source contact 110 and the bottommost surface 112b of the drain contact 112 directly contact the topmost surface 108t of the active layer 108.

Figure 3:
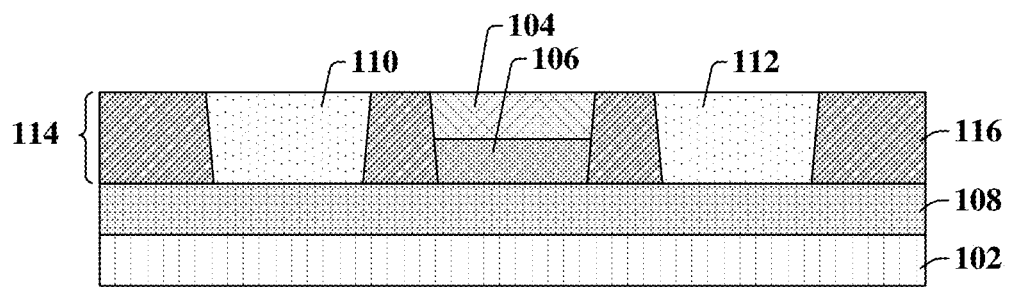
FIG. 3 illustrates a cross-sectional view of some embodiments of a top-gate thin film transistor comprising a passivation structure laterally between a source contact, a drain contact, and a gate electrode structure, wherein the passivation structure comprises silicon carbide.

FIG. 3 illustrates a cross-sectional view 300 of some embodiments of a top-gate TFT.

The integrated chip of FIG. 3 includes a gate electrode 104 arranged over the active layer 108, such that the TFT of FIG. 3 is called a "top-gate" TFT. In some such embodiments, the gate dielectric layer 106 is arranged between the gate electrode 104 and the active layer 108. Further, in some embodiments, the gate electrode 104 and the gate dielectric layer 106 extend through the passivation structure 114. In some embodiments, the gate electrode 104 and the gate dielectric layer 106 are arranged laterally between the source contact 110 and the drain contact 112. Thus, in some embodiments, the gate electrode 104 and the gate dielectric layer 106 are separated from the source contact 110 and the drain contact 112 by the passivation structure 114. In some embodiments, the passivation structure 114 comprises the first passivation layer 116.

Figure 4A:
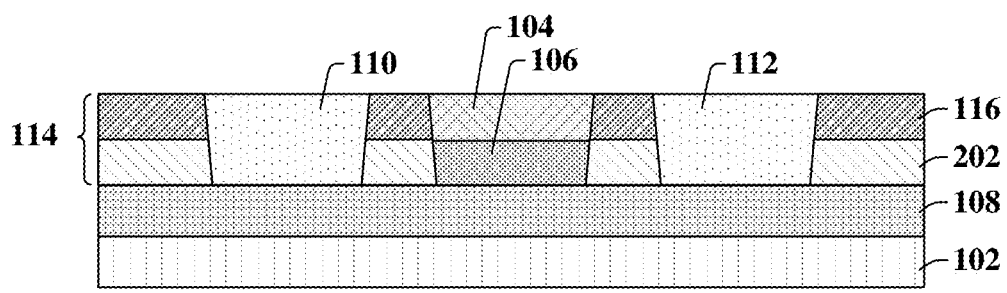
FIG. 4A illustrates a cross-sectional view of some other embodiments of a top-gate thin film transistor comprising a passivation structure laterally between a source contact, a drain contact, and a gate electrode structure, wherein the passivation structure comprises two layers and comprises silicon carbide.

FIG. 4A illustrates a cross-sectional view 400A of some embodiments of a top-gate TFT, wherein the passivation structure comprises more than one layer.

In some other embodiments of a top-gate TFT, the passivation structure 114 comprises the second passivation layer 202 arranged between the first passivation layer 116 and the active layer 108. In some embodiments, at least the first passivation layer 116, which makes up the upper portion of the passivation structure 114 comprises a material that has a high film density, is hydrophobic, and is electrically insulating to prevent moisture (e.g., water) and oxygen from the environment from damaging the active layer 108.

Figure 4B:
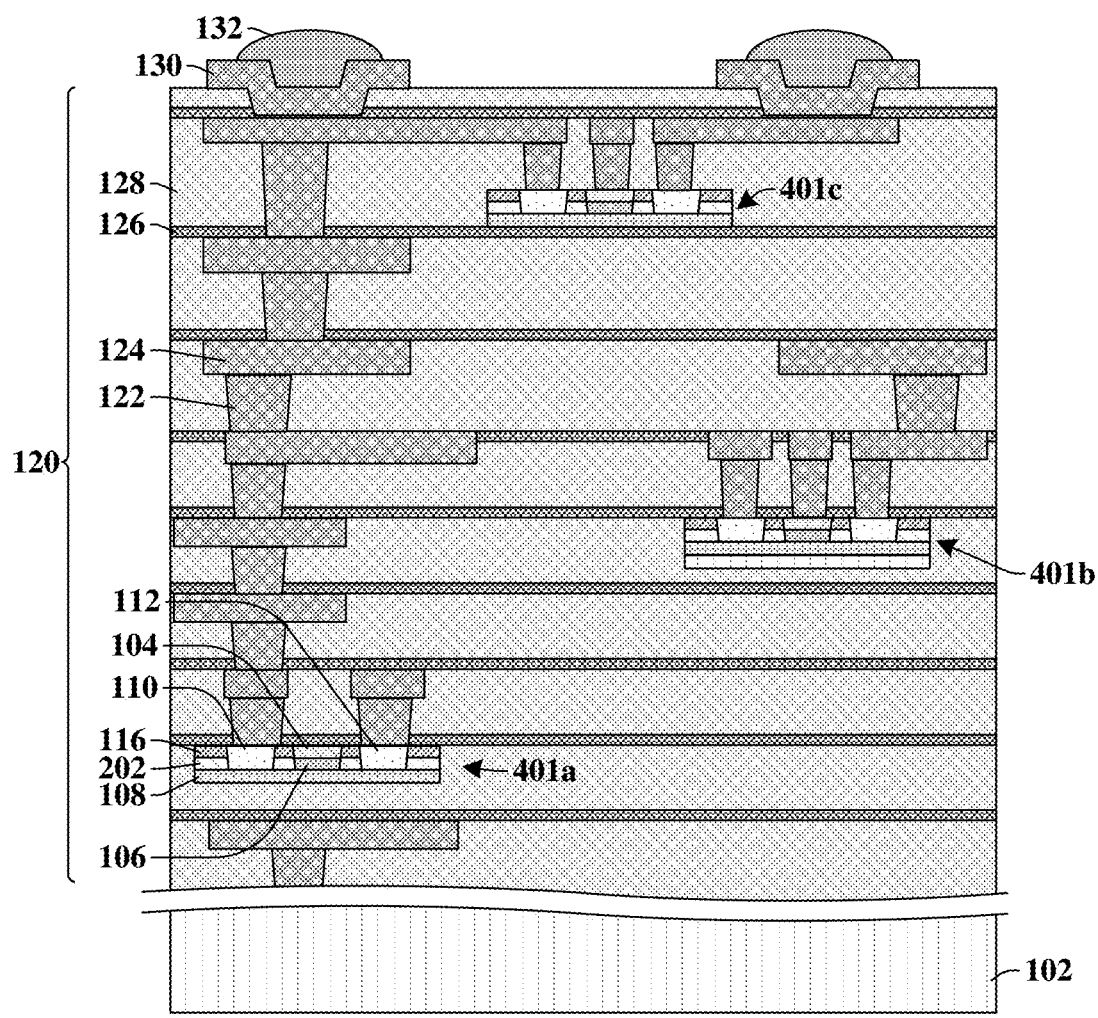
FIG. 4B illustrates a cross-sectional view of some embodiments of the top-gate thin film transistor of FIG. 4A in a back-end-of-line interconnect structure.

FIG. 4B illustrates a cross-sectional view 400B of some embodiments of a back-end-of-line (BEOL) interconnect structure comprising the top-gate TFT of FIG. 4A.

In some embodiments, a first top-gate TFT 401a may be arranged within a lower portion of the BEOL interconnect structure 120, and interconnect vias 122 may be electrically coupled to the source contact 110 and the drain contact 112. In some embodiments, a second top-gate TFT 401b may be arranged in a middle portion of the BEOL interconnect structure 120. In some embodiments, the second top-gate TFT 401b may have an active layer 108 arranged over a substrate 102 of the second top-gate TFT 401b or arranged over some other supportive structure. In some embodiments, an interconnect via 122 is also coupled to the gate electrode 104 of the second top-gate TFT 401b. In some embodiments, a third top-gate TFT 401c is arranged in an upper portion of the BEOL structure 120, and the active layer 108 of the third top-gate TFT 401c may be arranged directly on the etch stop layer 126.

Thus, the cross-sectional view 400B of FIG. 4B illustrates various areas that a top-gate TFT may be arranged in a BEOL interconnect structure 120. In some embodiments, high temperatures are used during the formation of the BEOL interconnect structure 120. Thus, because of the top-gate TFTs (e.g., 401a-c) comprise a passivation structure (114 of FIG. 4A) that comprise a material that can maintain its properties when exposed to high temperatures (e.g., greater than 250 degrees Celsius), the top-gate TFTs (e.g., 401a-c) may be integrated into the BEOL interconnect structure 120 without suffering damage. Further, because of the small size of the top-gate TFTs (e.g., 401a-c), the top-gate TFTs (e.g., 401a-c) may be integrated in the BEOL interconnect structure 120 without increasing the height of the BEOL interconnect structure 120.

It will be appreciated that in some other embodiments, a combination of bottom-gate TFTs (e.g., 101a-d of FIG. 1B) and top-gate TFTs (e.g., 401a-c) may be integrated into a same BEOL interconnect structure 120.

FIGS. 5-11B illustrate cross-sectional views 500-1100B of some embodiments of a method of forming a bottom-gate thin film transistor (TFT) having a passivation structure comprising silicon carbide. Although FIGS. 5-11B are described in relation to a method, it will be appreciated that the structures disclosed in FIGS. 5-11B are not limited to such a method, but instead may stand alone as structures independent of the method.

Figure 5:
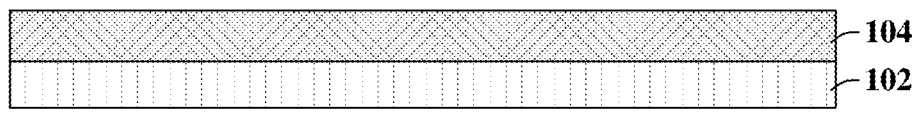
FIGS. 5-11B illustrate cross-sectional views of some embodiments of a method of forming a bottom-gate thin film transistor having a passivation structure that mitigates water and oxygen from the surrounding environment from damaging an active layer arranged beneath the passivation structure.

As shown in cross-sectional view 500 of FIG. 5, a substrate 102 is provided. In some embodiments, the substrate 102 comprises a supportive material, such as, for example, glass. In some embodiments, the substrate 102 comprises a transparent material suitable for optical applications, whereas in other embodiments, the substrate 102 comprises a translucent or opaque material. Unlike many other types of transistors, in some embodiments, the substrate 102 is not a semiconductor material and is thus, used for support instead of also for electrical reasons. In some embodiments, a gate electrode 104 is formed over the substrate 102. In some embodiments, the gate electrode 104 may be formed by way of a deposition process (e.g., physical vapor deposition (PVD), chemical vapor deposition (CVD), plasma-enhanced CVD (PE-CVD), atomic layer deposition (ALD), sputtering, etc.). In some embodiments, the gate electrode 104 comprises a conductive material. In some embodiments, the gate electrode 104 also comprises a transparent material for use in optical applications. For example, in some embodiments, the gate electrode 104 may comprise indium tin oxide, doped zinc oxide, or some other suitable transparent, conducting material. In some embodiments, the gate electrode 104 is formed to have a thickness in a range of between, for example, approximately 3 nanometers and approximately 90 nanometers.

Figure 6:
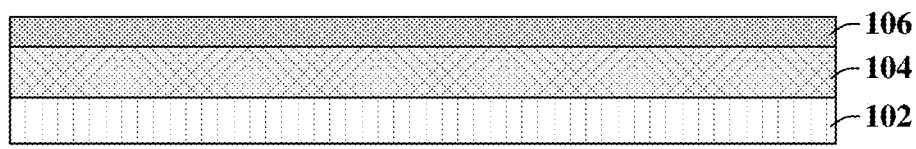

As shown in cross-sectional view 600 of FIG. 6, a gate dielectric layer 106 is formed over the gate electrode 104. In some embodiments, the gate dielectric layer 106 is formed by way of a deposition process (e.g., PVD, CVD, PE-CVD, ALD, sputtering, spin-on, etc.). In some embodiments, the gate dielectric layer 106 comprises a dielectric material. In some embodiments, the gate dielectric layer 106 also comprises a transparent material for optical applications. For example, in some embodiments, the gate dielectric layer 106 comprises hafnium oxide, zirconium oxide, aluminum oxide, lanthanum oxide, silicon dioxide, silicon nitride, a combination thereof, or some other suitable dielectric material. In some embodiments, the gate dielectric layer 106 is formed to have a thickness in a range of between, for example, approximately 3 nanometers and approximately 90 nanometers.

Figure 7:
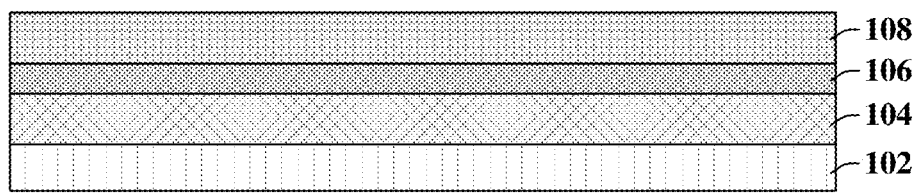

As shown in cross-sectional view 700 of FIG. 7, an active layer 108 is formed over the gate dielectric layer 106. In some embodiments, the active layer 108 is formed by way of a deposition process (e.g., PVD, CVD, PE-CVD, ALD, sputtering, spin-on, etc.). In some embodiments, the active layer 108 comprises a semiconductor material. In some embodiments, the active layer 108 also comprises a transparent material for optical applications. For example, in some embodiments, the active layer 108 comprises indium gallium zinc oxide, indium tin oxide, indium gallium oxide, indium zinc oxide, indium gallium zinc tin oxide, indium oxide, or some other suitable material. In some embodiments, the active layer 108 is formed to have a thickness in a range of between, for example, approximately 3 angstroms and approximately 90 nanometers.

Figure 8A:
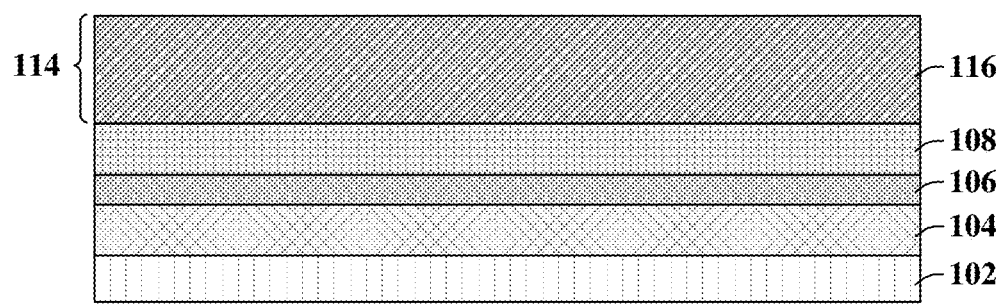

As shown in cross-sectional view 800A of FIG. 8A, a passivation structure 114 is formed over the active layer 108. In some embodiments, the passivation structure 114 comprises a first passivation layer 116. In some embodiments, the first passivation layer 116 is formed by way of a deposition process, such as chemical vapor deposition (CVD), for example. In some embodiments, the first passivation layer 116 may be formed in a chamber set to a temperature in a range of between, for example, approximately 200 degrees Celsius and approximately 400 degrees Celsius. In other embodiments, the first passivation layer 116 may be formed by some other deposition process such as, for example, PVD, ALD, or the like. In some embodiments, the passivation structure 114 has a thickness in a range of between, for example, approximately 5 nanometers and approximately 1000 nanometers.

In some embodiments, the passivation structure 114 comprises a material that has a high film density, is hydrophobic, and is electrically insulating, such as oxygen-doped silicon carbide, nitrogen-doped silicon carbide, a mixture thereof, or the like. The passivation structure 114 prevents moisture (e.g., water) and oxygen from the environment from damaging the active layer 108.

Figure 8B:
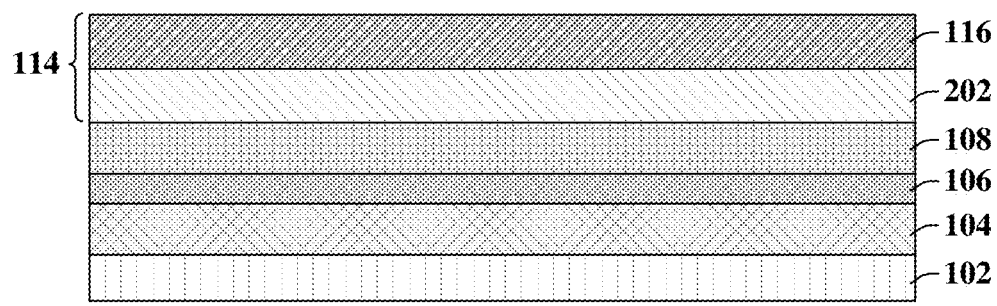

FIG. 8B illustrates a cross-sectional view 800B of some other embodiments of forming the passivation structure 114 over the active layer 108.

As shown in the cross-sectional view 800B of FIG. 8B, in some other embodiments, the passivation structure 114 comprises a second passivation layer 202 arranged below the first passivation layer 116 such that the second passivation layer 202 is arranged between the first passivation layer 116 and the active layer 108. Thus, in some embodiments, the second passivation layer 202 is formed over the active layer 108, and then, the first passivation layer 116 is formed over the second passivation layer 202. In some embodiments, the second passivation layer 202 is formed by way of a deposition process (e.g., PVD, CVD, ALD, etc.).

In some embodiments, at least the first passivation layer 116 comprises a material that has a high film density, is hydrophobic, and is electrically insulating, such as oxygen-doped silicon carbide, nitrogen-doped silicon carbide, a mixture thereof, or the like. In some embodiments, the second passivation layer 202 may comprise a material that has a high film density, is hydrophobic, and is electrically insulating, such as oxygen-doped silicon carbide, nitrogen-doped silicon carbide, a mixture thereof, or the like; or the second passivation layer 202 may comprise a material that has a lower film density and/or is less hydrophobic than the first passivation layer 116, such as, for example, silicon dioxide, silicon nitride, aluminum oxide, hafnium oxide, hafnium zirconium oxide, or the like.

Figure 9A:
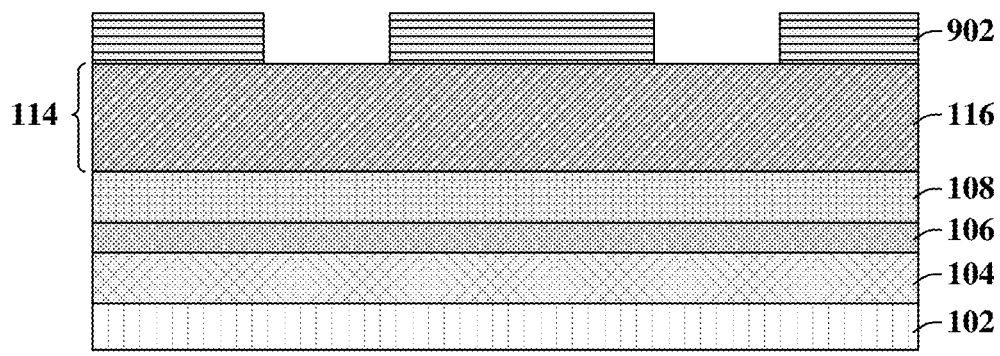
Figure 10A:
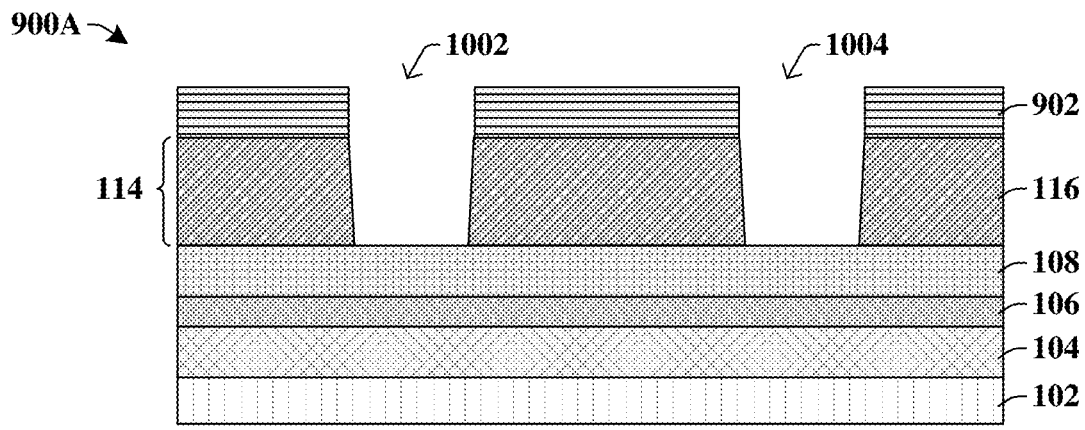
Figure 11A:
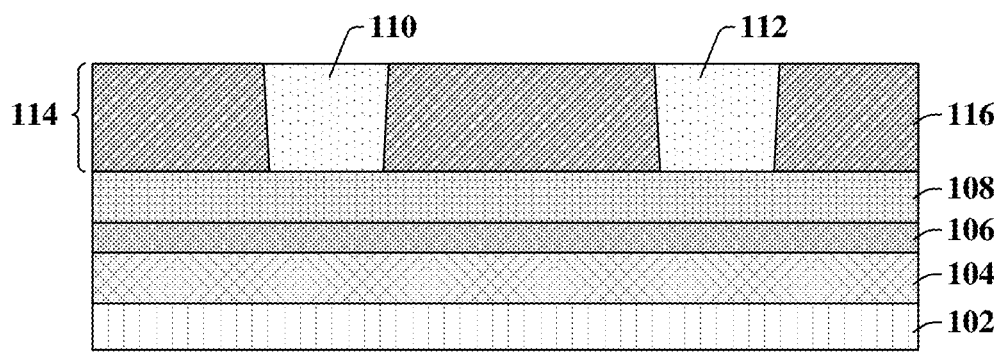

FIGS. 9A, 10A, and 11A illustrate some embodiments of the subsequent steps of a method of forming a bottom-gate TFT having a passivation structure 114 comprising the first passivation layer 116 after the formation of the passivation structure 114 in FIG. 8A. Thus, in some embodiments, wherein the passivation structure 114 comprises the first passivation layer 116, the method includes steps illustrated in FIGS. 5-7, 8A, 9A, 10A, and 11A.

Figure 9B:
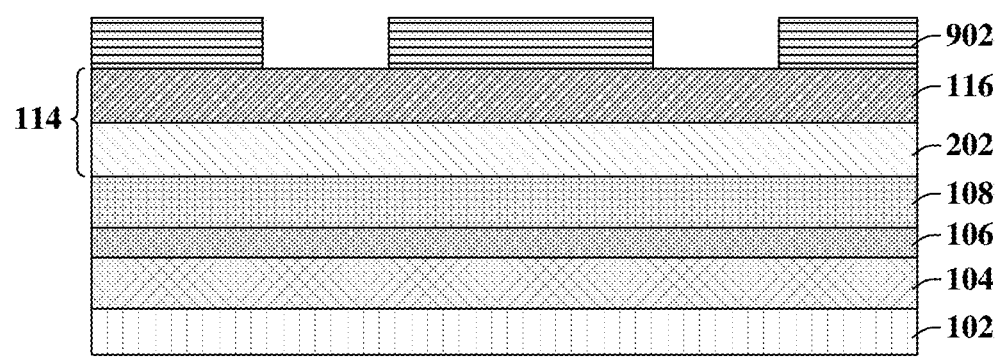
Figure 10B:
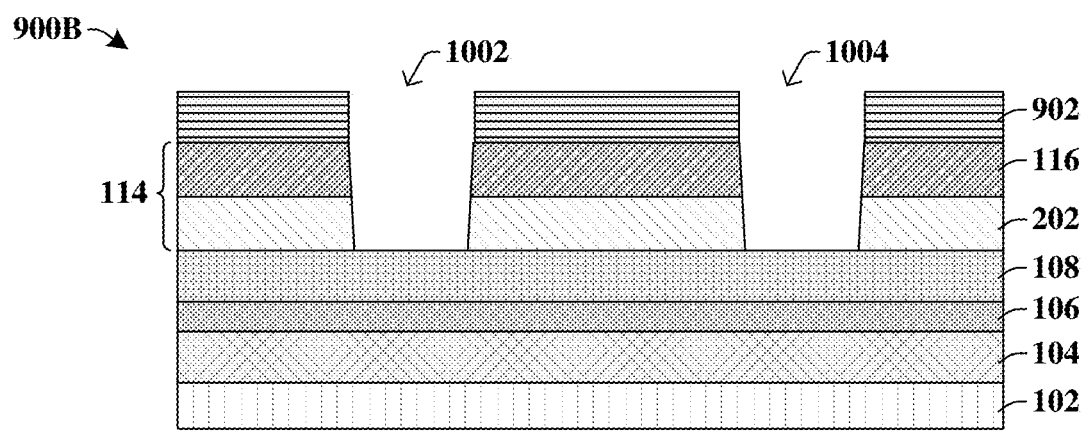
Figure 11B:
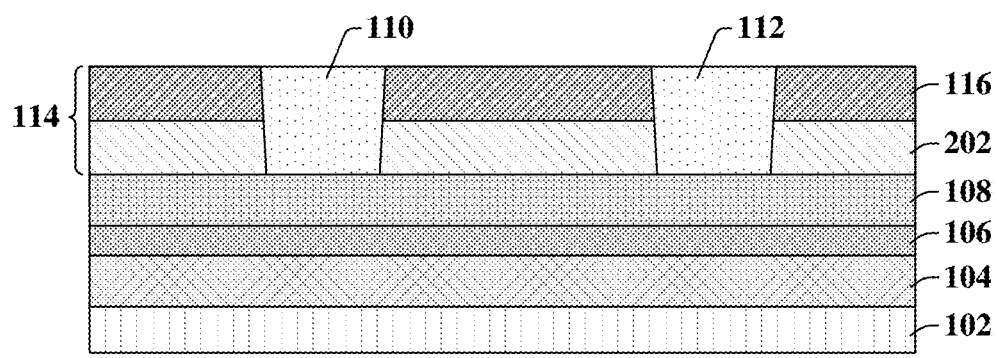

FIGS. 9B, 10B, and 11B illustrates some embodiments of the subsequent steps of a method of forming a bottom-gate TFT having a passivation structure 114 comprising the first passivation layer 116 and the second passivation layer 202 after the formation of the passivation structure 114 in FIG. 8B. Thus, in some embodiments, wherein the passivation structure 114 comprises the first passivation layer 116 and the second passivation layer 202, the method includes steps illustrated in FIGS. 5-7, 8B, 9B, 10B, and 11B.

Thus, as shown in cross-sectional view 900A of FIG. 9A and in cross-sectional view 900B of FIG. 9B, a masking structure 902 is formed over the passivation structure 114. The masking structure 902 may be formed using photolithography and removal (e.g., etching) processes. In some embodiments, the masking structure 902 comprises a photoresist material or a hard mask material. In some embodiments, the masking structure 902 may comprise openings that expose upper surfaces of the first passivation layer 116.

As shown in cross-sectional view 1000A of FIG. 10A and in cross-sectional view 1000B of FIG. 10B, a removal process is performed to form a first opening 1002 and a second opening 1004 in the passivation structure 114. The first and second openings 1002, 1004 of the passivation structure 114 are based on the openings in the masking structure 902. In some embodiments, the first and second openings 1002, 1004 extend completely through the passivation structure 114 to expose the active layer 108. In some embodiments, the removal process of FIGS. 10A and 10B comprise a dry etching process or a wet etching process. In some embodiments, the active layer 108 comprises a material that is substantially resistant to removal by the removal process of FIGS. 10A and 10B such that damage to the active layer 108 by the removal process of FIGS. 10A and 10B is mitigated. In some other embodiments (not shown), the removal process of FIGS. 10A and 10B may remove a small portion of the active layer 108 such that the first and second openings 1002, 1004 extend below a topmost surface of the active layer 108.

Further, in some embodiments, the removal process of FIG. 10B may comprise multiple etchants, wherein a first etchant is used to remove the first passivation layer 116, and a second etchant is used to remove the second passivation layer 202. In other embodiments, a same etchant may be used to remove the first and second passivation layers 116, 202 in FIG. 10B.

As shown in cross-sectional view 1100A of FIG. 11A and in cross-sectional view 1100B of FIG. 11B, in some embodiments, a source contact 110 is formed in the first opening (1002 of FIGS. 10A and 10B) of the passivation structure 114, and a drain contact 112 is formed in the second opening (1004 of FIGS. 10A and 10B). In some embodiments, the source contact 110 and the drain contact 112 are by depositing a conductive material over the active layer 108 and the passivation structure 114 followed by removing excess conductive material arranged over the passivation structure 114. In some embodiments, the conductive material of the source and drain contacts 110, 112 is deposited by way of a deposition process (e.g., PVD, CVD, PE-CVD, ALD, sputtering, etc.). In some embodiments, excess conductive material is removed by a removal process such as, for example, a planarization process (e.g., chemical mechanical planarization) or an etching process.

In some embodiments, the source contact 110 is spaced apart from the drain contact 112 by the passivation structure 114. Further, the source contact 110 and the drain contact 112 extend completely through the passivation structure 114 to contact the active layer 108. In some embodiments, the source contact 110 and the drain contact 112 comprise a conductive material. In some embodiments, the conductive material may include a metal, such as, for example, copper, aluminum, tungsten, or the like. In some embodiments, the source contact 110 and the drain contact 112 comprise a conductive material that is also transparent such as, for example, indium tin oxide, doped zinc oxide, or the like.

Thus, in some embodiments, the active layer 108 is covered by the passivation structure 114 and the source and drain contacts 110, 112. Because the passivation structure 114 comprises at least an upper portion that comprises a material that has a high film density, is hydrophobic, and is electrically insulating, the passivation structure 114 can mitigate moisture (e.g., water) and oxygen from entering the active layer 108, thereby reducing damage to the active layer 108 and increasing the reliability of the bottom-gate TFT.

Figure 12:
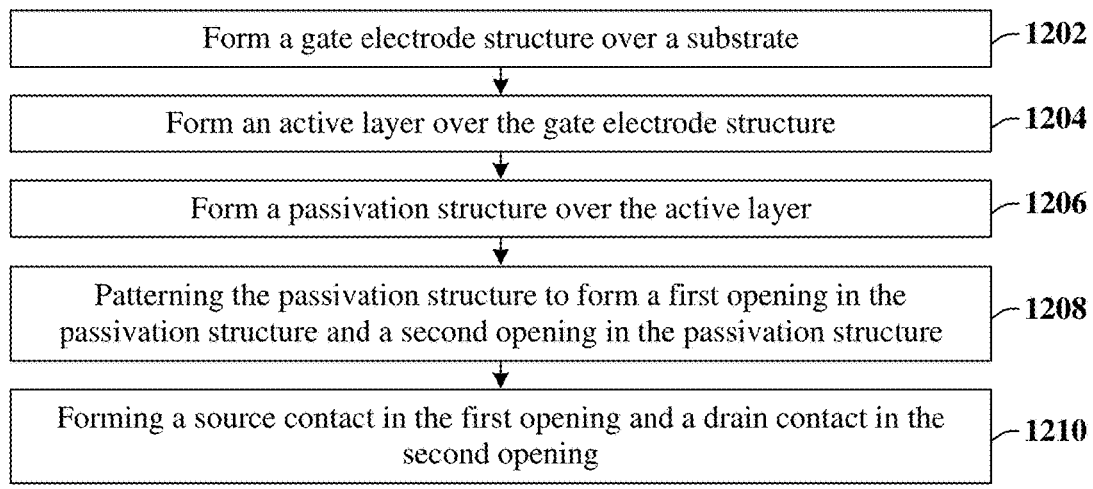
FIG. 12 illustrates a flow diagram of some embodiments corresponding to the method of FIGS. 5-11B.

FIG. 12 illustrates a flow diagram of some embodiments of a method 1200 of forming a bottom-gate TFT comprising a passivation layer that comprises silicon carbide.

While method 1200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1202, a gate electrode is formed over a substrate. FIG. 5 illustrates a cross-sectional view 500 of some embodiments corresponding to act 1202.

At act 1204, an active layer is formed over the gate electrode structure. FIG. 7 illustrates a cross-sectional view 700 of some embodiments corresponding to act 1204.

At act 1206, a passivation structure is formed over the active layer. FIG. 8A illustrates a cross-sectional view 800A of some embodiments corresponding to act 1206.

At act 1208, the passivation structure is patterned to form a first opening in the passivation structure and a second opening in the passivation structure. FIG. 10A illustrates a cross-sectional view 1000A of some embodiments corresponding to act 1208.

At act 1210, a source contact is formed in the first opening, and a drain contact is formed in the second opening. FIG. 11A illustrates a cross-sectional view 1100A of some embodiments corresponding to act 1210.

FIGS. 13-19B illustrate cross-sectional views 1300-1900B of some embodiments of a method of forming a top-gate thin film transistor (TFT) having a passivation structure comprising silicon carbide. Although FIGS. 13-19B are described in relation to a method, it will be appreciated that the structures disclosed in FIGS. 13-19B are not limited to such a method, but instead may stand alone as structures independent of the method.

Figure 13:
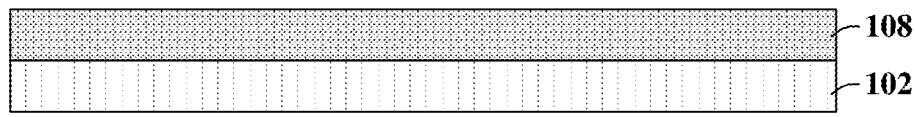
FIGS. 13-19B illustrate cross-sectional views of some embodiments of a method of forming a top-gate thin film transistor having a passivation structure that mitigates water and oxygen from the surrounding environment from damaging an active layer arranged beneath the passivation structure.

As shown in cross-sectional view 1300 of FIG. 13, in some embodiments, the active layer 108 is formed over the substrate 102.

Figure 14:
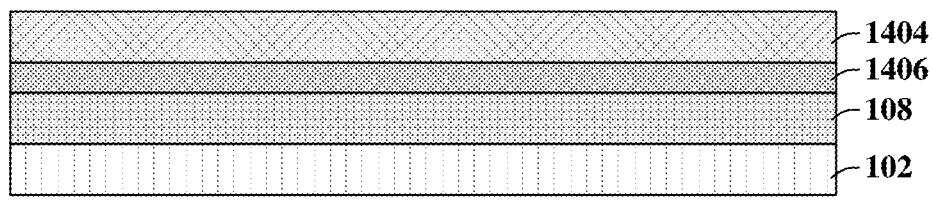

As shown in cross-sectional view 1400 of FIG. 14, in some embodiments, a continuous gate dielectric layer 1406 is formed over the active layer 108, and a continuous gate electrode layer 1404 is formed over the continuous gate dielectric layer 1406.

Figure 15:
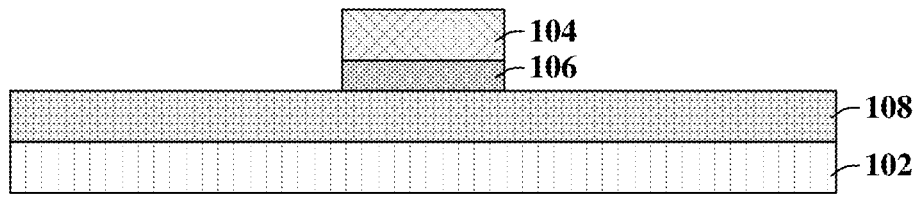

As shown in cross-sectional view 1500 of FIG. 15, in some embodiments, a removal process is performed to remove peripheral portions of the continuous gate dielectric layer (1406 of FIG. 14) and of the continuous gate electrode layer (1404 of FIG. 14) to form the gate dielectric layer 106 and the gate electrode 104, respectively. Thus, in some embodiments, the gate electrode 104 is arranged over the active layer 108 and the gate dielectric layer 106.

In some embodiments, prior to the removal process of FIG. 15, a masking structure may be formed over the continuous gate electrode layer (1404 of FIG. 14). In some such embodiments, the masking structure (not shown) may be formed using photolithography and removal (e.g., etching) processes. Then, in some embodiments, the removal process of FIG. 15 may remove portions of the continuous gate dielectric layer (1406 of FIG. 14) and the continuous gate electrode layer (1404 of FIG. 14) that do not directly underlie the masking structure. In some embodiments, the removal process of FIG. 15 may comprise a wet or dry etching process. In some embodiments, the removal process of FIG. 15 may comprise more than one etchant. Further, in some embodiments, the active layer 108 is substantially resistant to removal by the removal process of FIG. 15.

Figure 16A:
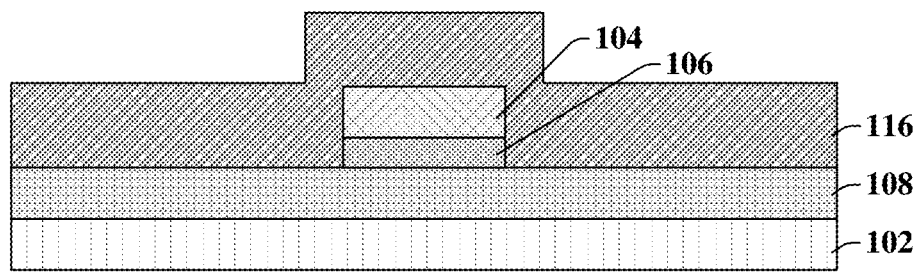

As shown in cross-sectional view 1600A of FIG. 16A, in some embodiments, a first passivation layer 116 is formed over the active layer 108 and the gate electrode 104. In some embodiments, the first passivation layer 116 is at least as thick as a sum of the thicknesses of the gate electrode 104 and the gate dielectric layer 106.

In some embodiments, the first passivation layer 116 comprises a material that has a high film density, is hydrophobic, and is electrically insulating, such as oxygen-doped silicon carbide, nitrogen-doped silicon carbide, a mixture thereof, or the like. The first passivation layer 116 prevents moisture (e.g., water) and oxygen from the environment from damaging the active layer 108.

Figure 16B:
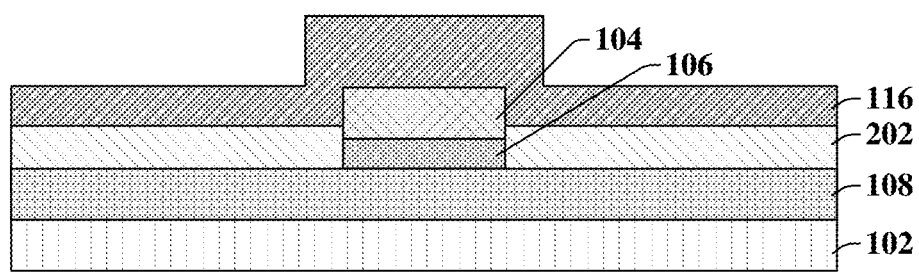

FIG. 16B illustrates a cross-sectional view 1600B of some other embodiments of forming the first passivation layer 116 over the active layer 108.

As shown in the cross-sectional view 1600B of FIG. 16B, in some other embodiments, a second passivation layer 202 is formed over the active layer 108 prior to the forming of the first passivation layer 116. In some embodiments, the second passivation layer 202 is formed over the active layer 108 and the gate electrode 104. Then, in some embodiments, a removal process (e.g., etching process) is performed to remove portions of the second passivation layer 202 that are arranged over the gate electrode 104. The remaining second passivation layer 202 still covers the active layer 108. In some embodiments, the first passivation layer 116 is then formed over the second passivation layer 202 and the gate electrode 104. In some embodiments, a sum of the thicknesses of the first and second passivation layers 116, 202 are greater than or equal to a sum of the thicknesses of the gate electrode 104 and the gate dielectric layer 106.

Figure 17A:
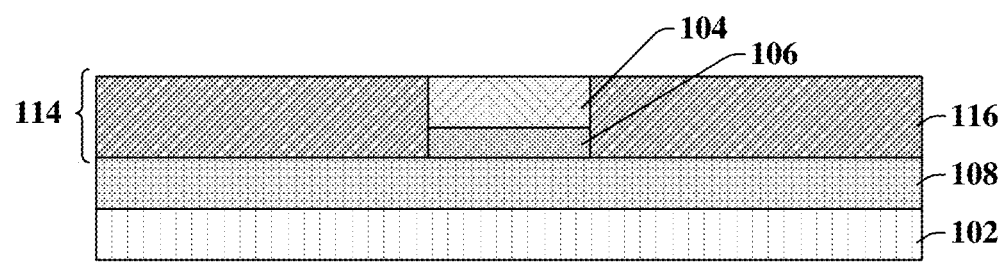
Figure 18A:
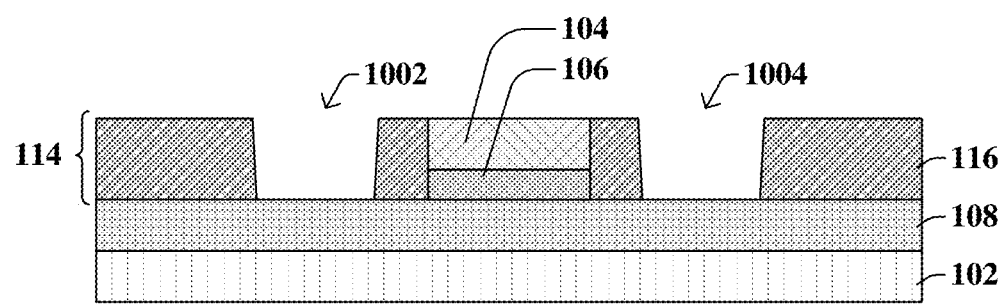
Figure 19A:
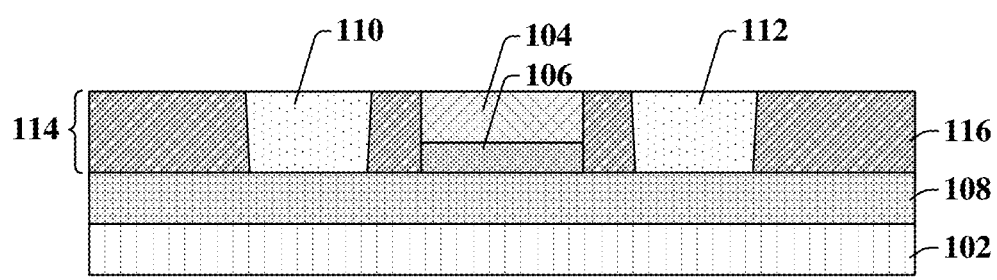

FIGS. 17A, 18A, and 19A illustrate some embodiments of the subsequent steps of a method of forming a top-gate TFT having a passivation structure 114 comprising the first passivation layer 116 after FIG. 16A. Thus, in some embodiments, wherein the passivation structure 114 comprises the first passivation layer 116, the method includes steps illustrated in FIGS. 13-15, 16A, 17A, 18A, and 19A.

Figure 17B:
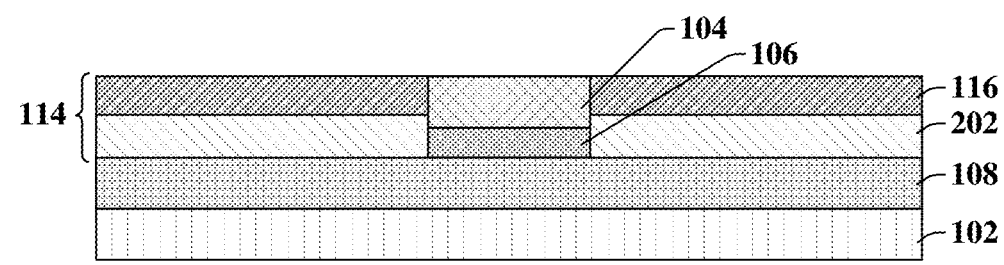
Figure 18B:
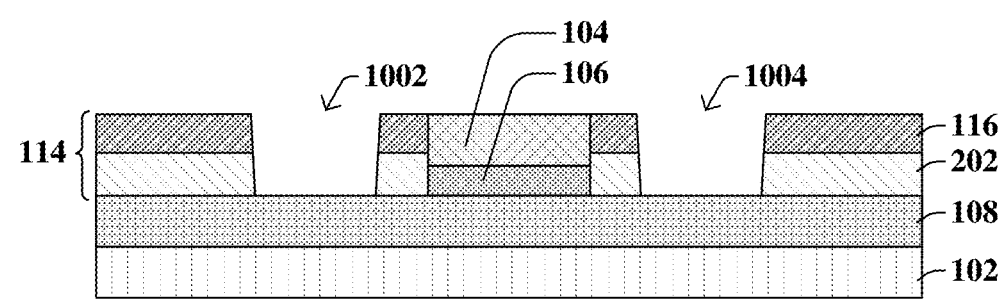
Figure 19B:
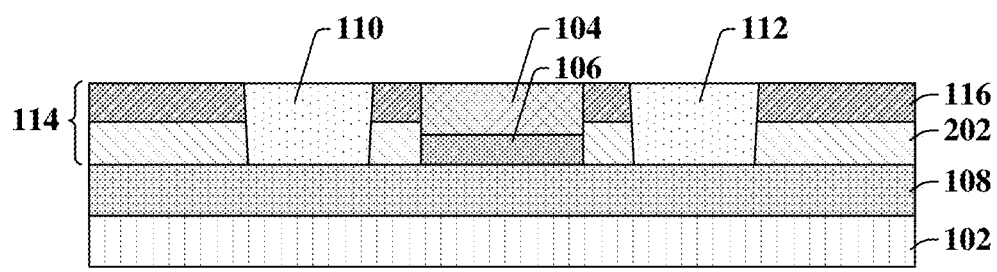

FIGS. 17B, 18B, and 19B illustrates some embodiments of the subsequent steps of a method of forming a top-gate TFT having a passivation structure 114 comprising the first passivation layer 116 and the second passivation layer 202 after FIG. 16B. Thus, in some embodiments, wherein the passivation structure 114 comprises the first passivation layer 116 and the second passivation layer 202, the method includes steps illustrated in FIGS. 13-15, 16B, 17B, 18B, and 19B.

As shown in cross-sectional view 1700A of FIG. 17A and in cross-sectional view 1700B of FIG. 17B, in some embodiments, a removal process is performed to remove portions of the first passivation layer 116 arranged over the gate electrode 104. In some embodiments, the removal process of FIGS. 17A and 17B comprises an etching process or a planarization process (e.g., chemical mechanical planarization). In some embodiments, the gate electrode 104 and the first passivation layer 116 have substantially coplanar upper surfaces after the removal process of FIGS. 17A and 17B.

After the removal process of FIG. 17A, a passivation structure 114 comprising the first passivation layer 116 is arranged over the active layer 108 and surrounds the gate electrode 104 and gate dielectric layer 106. After the removal process of FIG. 17B, a passivation structure 114 comprising the first passivation layer 116 and the second passivation layer 202 is arranged over the active layer 108 and surrounds the gate electrode 104 and the gate dielectric layer 106.

As shown in cross-sectional view 1800A of FIG. 18A and in cross-sectional view 1800B of FIG. 18B, in some embodiments, a removal process is performed to form a first opening 1002 within the passivation structure 114 on a first side of the gate electrode 104 and a second opening 1004 within the passivation structure 114 on a second side of the gate electrode 104. In some embodiments, the first and second openings 1002, 1004 are formed by way of a masking structure (e.g., 902 of FIGS. 9A and 9B) and a removal process as described with respect to FIGS. 9A, 9B, 10A, and 10B. In some embodiments, the passivation structure 114 separates the gate electrode 104 from the first and second openings 1002, 1004.

As shown in cross-sectional view 1900A of FIG. 19A and in cross-sectional view 1900B of FIG. 19B, in some embodiments, a source contact 110 is formed within the first opening (1002 of FIGS. 18A and 18B), and a drain contact 112 is formed within the second opening (1004 of FIGS. 18A and 18B). In some embodiments, the passivation structure 114 electrically separates the source contact 110 from the gate electrode 104 and the drain contact 112 from the gate electrode 104.

Thus, in some embodiments, the active layer 108 is covered by the passivation structure 114, the source and drain contacts 110, 112, and the gate dielectric layer 106. Because the passivation structure 114 comprises at least an upper portion that comprises a material that has a high film density, is hydrophobic, and is electrically insulating, the passivation structure 114 can mitigate moisture (e.g., water) and oxygen from entering the active layer 108, thereby reducing damage to the active layer 108 and increasing the reliability of the top-gate TFT.

Figure 20:
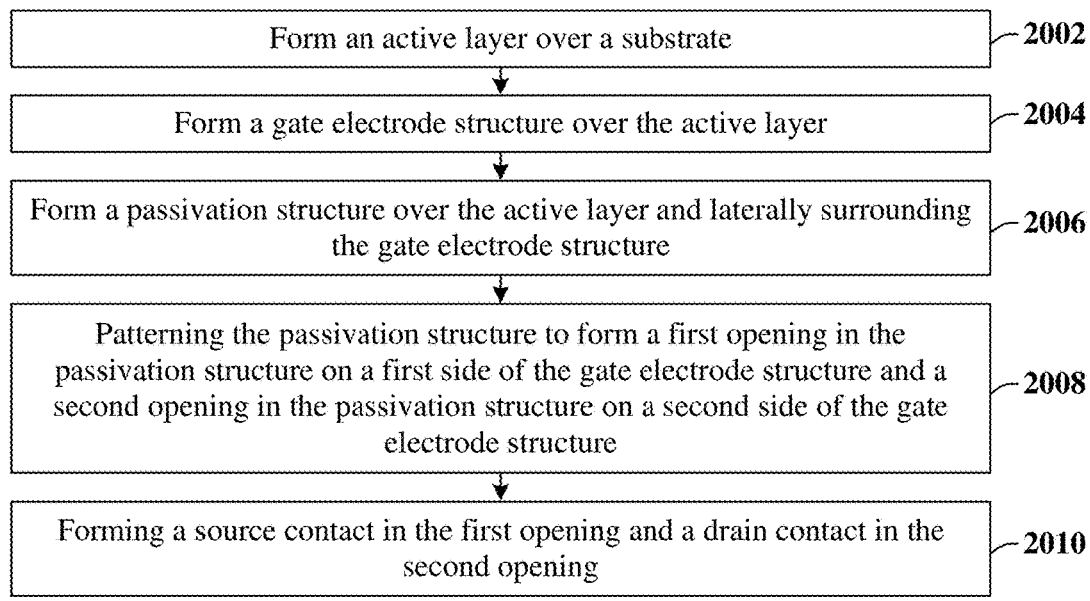
FIG. 20 illustrates a flow diagram of some embodiments corresponding to the method of FIGS. 13-19B.

FIG. 20 illustrates a flow diagram of some embodiments of a method 2000 of forming a top-gate TFT comprising a passivation layer that comprises silicon carbide.

While method 2000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2002, an active layer is formed over a substrate. FIG. 13 illustrates a cross-sectional view 1300 of some embodiments corresponding to act 2002.

At act 2004, a gate electrode is formed over the active layer. FIG. 15 illustrates a cross-sectional view 1500 of some embodiments corresponding to act 2004.

At act 2006, a passivation structure is formed over the active layer and laterally surrounding the gate electrode structure. FIG. 16A illustrates a cross-sectional view 1600A of some embodiments corresponding to act 2006.

At act 2008, the passivation structure is patterned to form a first opening in the passivation structure on a first side of the gate electrode structure and a second opening in the passivation structure on a second side of the gate electrode structure. FIG. 18A illustrates a cross-sectional view 1800A of some embodiments corresponding to act 2008.

At act 2010, a source contact is formed in the first opening, and a drain contact is formed in the second opening. FIG. 19A illustrates a cross-sectional view 1900A of some embodiments corresponding to act 2010.

Therefore, the present disclosure relates to a method of forming a thin film transistor comprising a passivation layer over an active layer, wherein the passivation layer has an upper portion that comprises a material having a high film density and is hydrophobic to prevent moisture and oxygen from the environment from diffusing through the passivation layer and damaging the active layer.

Accordingly, in some embodiments, the present disclosure relates to a device comprising: an active layer arranged over a substrate; a gate electrode arranged over the substrate and spaced apart from the active layer by a gate dielectric layer; a passivation structure arranged over the active layer; a source contact extending through the passivation structure and contacting the active layer; and a drain contact extending through the passivation structure and contacting the active layer, wherein the passivation structure is hydrophobic.

In other embodiments, the present disclosure relates to a device comprising: an active layer arranged over a substrate; a gate electrode arranged on a first side of the active layer and spaced apart from the active layer by a gate dielectric layer; a passivation structure arranged on the active layer; a source contact extending through the passivation structure to contact the passivation structure; and a drain contact extending through the passivation structure to contact the passivation structure, wherein an upper portion of the passivation structure comprises silicon carbide.

In yet other embodiments, the present disclosure relates to a method comprising: forming an active layer over a substrate; forming a gate electrode over the substrate, wherein a gate dielectric layer separates the gate electrode form the active layer; forming a passivation structure over the active layer; patterning the passivation structure to form a first opening in the passivation structure and a second opening in the passivation structure, wherein the passivation structure comprises silicon carbide; and forming a source contact in the first opening and a drain contact in the second opening, wherein the source and drain contacts contact the active layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an active layer over a substrate;
   forming a gate electrode over the substrate, wherein a gate dielectric layer separates the gate electrode form the active layer;
   forming a passivation structure over the active layer;
   patterning the passivation structure to form a first opening in the passivation structure and a second opening in the passivation structure;
   forming a source contact in the first opening and a drain contact in the second opening, wherein the source and drain contacts contact the active layer; and
   wherein the passivation structure comprises an upper portion and a lower portion arranged around the source and drain contacts, the upper portion including one or more of oxygen-doped silicon carbide and nitrogen-doped silicon carbide.

2. The method of claim 1, wherein a topmost surface of the gate electrode physically contacts a bottommost surface of the gate dielectric layer along an interface that continuously and laterally extends past opposing outermost sides of both the first opening and the second opening.

3. The method of claim 1, wherein the passivation structure has a maximum height that is less than or equal to a maximum height of the source and drain contacts.

4. The method of claim 3, wherein the passivation structure is formed to have topmost and bottommost surfaces laterally between the source contact and the gate electrode.

5. The method of claim 3, wherein the upper portion of the passivation structure comprises a mixture of both the oxygen-doped silicon carbide and nitrogen-doped silicon carbide.

6. The method of claim 3, wherein the passivation structure comprises a flat lower surface that continuously extends between a first sidewall of the passivation structure that forms the first opening and a second sidewall of the passivation structure that forms the second opening.

7. A method, comprising:
forming one or more interconnects within a dielectric layer over a substrate;
forming an active layer over the dielectric layer;
forming a gate electrode over the dielectric layer, wherein a gate dielectric separates the gate electrode from the active layer;
forming a passivation structure over the active layer;
forming a source contact and a drain contact within the passivation structure, wherein the source contact and the drain contact are laterally separated by a part of the passivation structure; and
wherein the passivation structure comprises an upper portion and a lower portion arranged around the source and drain contacts, the upper portion including one or more of oxygen-doped silicon carbide and nitrogen-doped silicon carbide.

8. The method of claim 7, wherein the lower portion of the passivation structure and the upper portion of the passivation structure laterally surround the source contact and the drain contact.

9. The method of claim 8, wherein the upper portion of the passivation structure extends from above a bottom of the source contact to a top of the source contact.

10. The method of claim 8, wherein the source contact and the drain contact vertically extend to a top of the passivation structure.

11. The method of claim 8, wherein a height of the source contact is substantially equal to a height of the passivation structure.

12. The method of claim 8, wherein the passivation structure is arranged along sidewalls of the gate electrode and the gate dielectric.

13. The method of claim 12, wherein the passivation structure laterally separates the gate electrode and the gate dielectric from the source contact and the drain contact.

14. The method of claim 12, wherein the passivation structure laterally and continuously extends from a sidewall of the gate electrode to a sidewall of the source contact.

15. A method, comprising:
forming an active layer over a substrate;
forming a gate electrode over the substrate, wherein the gate electrode is separated from the active layer by a gate insulator;
forming a passivation structure over the active layer;
forming a source contact and a drain contact over the active layer, wherein the source contact and the drain contact extend from a top surface of the passivation structure to the active layer; and
wherein the passivation structure comprises an upper portion and a lower portion arranged around the source and drain contacts, the upper portion including one or more of oxygen-doped silicon carbide and nitrogen-doped silicon carbide.

16. The method of claim 15, further comprising:
forming an inter-level dielectric (ILD) layer over the substrate;
forming an interconnect within the ILD layer; and
wherein the gate electrode and the passivation structure are laterally separated from the interconnect by the ILD layer.

17. The method of claim 15, wherein the active layer comprises indium gallium zinc oxide, indium tin oxide, indium gallium oxide, indium zinc oxide, indium gallium zinc tin oxide, or indium oxide.

18. The method of claim 15, wherein the passivation structure physically contacts the active layer.

19. The method of claim 15, wherein the passivation structure physically contacts the active layer along an interface that is vertically below the gate electrode.

20. The method of claim 15, wherein the upper portion of the passivation structure contacts the lower portion of the passivation structure along an interface that continuously extends between the source contact and the drain contact.

* * * * *